(12) United States Patent
Jablonski et al.

(10) Patent No.: US 10,166,914 B2
(45) Date of Patent: Jan. 1, 2019

(54) SEPARABLE DISPLAY ARTICLE

(71) Applicant: GM GLOBAL TECHNOLOGY OPERATIONS LLC, Detroit, MI (US)

(72) Inventors: Robert C. Jablonski, Rochester Hills, MI (US); Jason E. Diehl, Washington Township, MI (US); Thomas A. Seder, Fraser, MI (US); James A. Carpenter, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 66 days.

(21) Appl. No.: 15/443,254

(22) Filed: Feb. 27, 2017

(65) Prior Publication Data
US 2018/0244196 A1 Aug. 30, 2018

(51) Int. Cl.
| | |
|---|---|
| *B60Q 3/283* | (2017.01) |
| *B60Q 3/20* | (2017.01) |
| *B60R 21/203* | (2006.01) |
| *B60R 21/2165* | (2011.01) |
| *F21V 19/00* | (2006.01) |
| *B60K 35/00* | (2006.01) |
| *B62D 1/10* | (2006.01) |

(Continued)

(52) U.S. Cl.
CPC ............. *B60Q 3/283* (2017.02); *B60K 35/00* (2013.01); *B60Q 3/20* (2017.02); *B60R 21/203* (2013.01); *B60R 21/21656* (2013.01); *B62D 1/10* (2013.01); *F21V 19/002* (2013.01); *H01L 27/156* (2013.01); *H01L 33/483* (2013.01); *B60K 2350/2004* (2013.01); *B60K 2350/407* (2013.01); *B60R 2021/21512* (2013.01); *F21Y 2115/10* (2016.08)

(58) Field of Classification Search
CPC ........ B60Q 3/20; B60Q 3/283; B60R 21/203; B60R 21/21656; B60R 2021/21512; B62D 1/10; F21V 19/002; H01L 27/156; H01L 33/483
See application file for complete search history.

(56) References Cited

U.S. PATENT DOCUMENTS

| | | | |
|---|---|---|---|
| 7,972,875 B2 * | 7/2011 | Rogers | H01L 21/00 257/E21.206 |
| 8,704,448 B2 * | 4/2014 | Tischler | H05B 33/0821 315/185 R |

(Continued)

*Primary Examiner* — Alan B Cariaso
(74) *Attorney, Agent, or Firm* — Quinn IP Law

(57) ABSTRACT

A display article includes a film formed from a stretchable plastic and including a first plurality of micro-light emitting diodes and a second plurality of micro-light emitting diodes disposed adjacent to the first plurality and embedded in the plastic. The article includes a substrate having a first portion and a second portion, and a tear seam disposed between the first and second portions. The film is attached to the substrate such that the tear seam is located between the first and second pluralities. A component includes the display article and an airbag disposed adjacent the substrate and configured for transitioning between a stowed position in which the airbag does not extend through the substrate, and a deployed position in which the airbag extends through the substrate and the film. The first and second portions are separated at the tear seam when the airbag is disposed in the deployed position.

12 Claims, 2 Drawing Sheets

(51) Int. Cl.
    *H01L 27/15*     (2006.01)
    *H01L 33/48*     (2010.01)
    *F21Y 115/10*     (2016.01)
    *B60R 21/215*     (2011.01)

(56) References Cited

U.S. PATENT DOCUMENTS

| | | | |
|---|---|---|---|
| 9,638,401 B2* | 5/2017 | Li | H05K 999/99 |
| 2016/0154170 A1* | 6/2016 | Thompson | G02F 1/133603 |
| | | | 362/609 |

* cited by examiner

SEPARABLE DISPLAY ARTICLE

INTRODUCTION

The present disclosure generally relates to a display article.

Devices often include a display to convey information to a user or operator. For example, a vehicle may include a display that presents information to an operator regarding weather conditions, vehicle speed, travel directions, and the like. Similarly, a pressurized device may include a display that presents information to a user regarding pressurization, internal temperature, and fluid level.

SUMMARY

A display article includes a film formed from a stretchable plastic and including a first plurality of micro-light emitting diodes and a second plurality of micro-light emitting diodes disposed adjacent to the first plurality of micro-light emitting diodes. The first plurality of micro-light emitting diodes and the second plurality of micro-light emitting diodes are embedded in the stretchable plastic. The display article also includes a substrate having a first portion, a second portion disposed adjacent the first portion, and a tear seam disposed between the first portion and the second portion. The film is attached to the substrate such that the tear seam is located between the first plurality of micro-light emitting diodes and the second plurality of micro-light emitting diodes.

In an exemplary aspect, the substrate may have a first face defining the tear seam and a second face spaced opposite the first face. The substrate may be configured to tear along the tear seam such that the first portion separates from the second portion when a force is applied to the substrate in a direction perpendicular to the first face. In an alternative aspect, the first face and the second face may define the tear seam.

For the display article, the stretchable plastic may be transparent. In one example, the stretchable plastic may be polydimethyl siloxane. Further, the substrate may be formed from polyethylene terephthalate and the film may be adhered to the substrate. In one aspect, the substrate may be a steering wheel of a vehicle. In another aspect, the substrate may be a support pillar defining a passenger compartment of a vehicle.

In a further aspect, the tear seam may have a first end and the substrate may define a first stress concentrator notch at the first end. Further, the first stress concentrator notch may be V-shaped and may have a vertex, and the tear seam may terminate at the vertex. In yet another aspect, the tear seam may have a second end spaced apart from the first end, and the substrate may define a second stress concentrator notch at the second end.

A component includes the display article and an airbag disposed adjacent the substrate. The airbag is configured for transitioning between a stowed position in which the airbag does not extend through the substrate and the film, and a deployed position in which the airbag extends through the substrate and the film. The first portion and the second portion are separated from one another at the tear seam when the airbag is disposed in the deployed position.

The first portion and the second portion may be joined at the tear seam when the airbag is disposed in the stowed position. Further, the airbag may transition from the stowed position to the deployed position in response to a force applied to the substrate in a direction perpendicular to the tear seam. The airbag may be disposed adjacent the substrate such that the substrate is disposed between the film and the airbag.

In one aspect, the film may be separatable into at least two segments as the airbag transitions from the stowed position to the deployed position, and the stretchable plastic may be transparent.

In an exemplary aspect, the substrate may be a steering wheel. In another aspect, the substrate may be a support pillar defining a passenger compartment of a vehicle.

The above features and advantages and other features and advantages of the present disclosure are readily apparent from the following detailed description of the best modes for carrying out the disclosure when taken in connection with the accompanying drawings.

DETAILED DESCRIPTION

Figure 1:
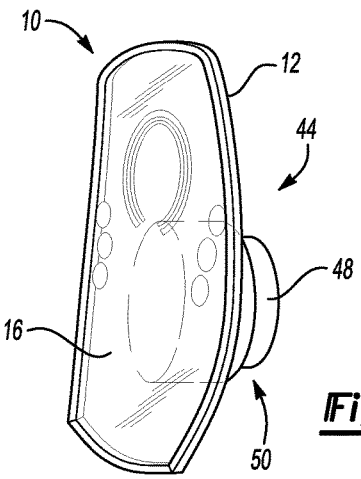
FIG. 1 is a schematic illustration of a perspective view of a display article that includes a film disposed on a substrate.
Figure 4:
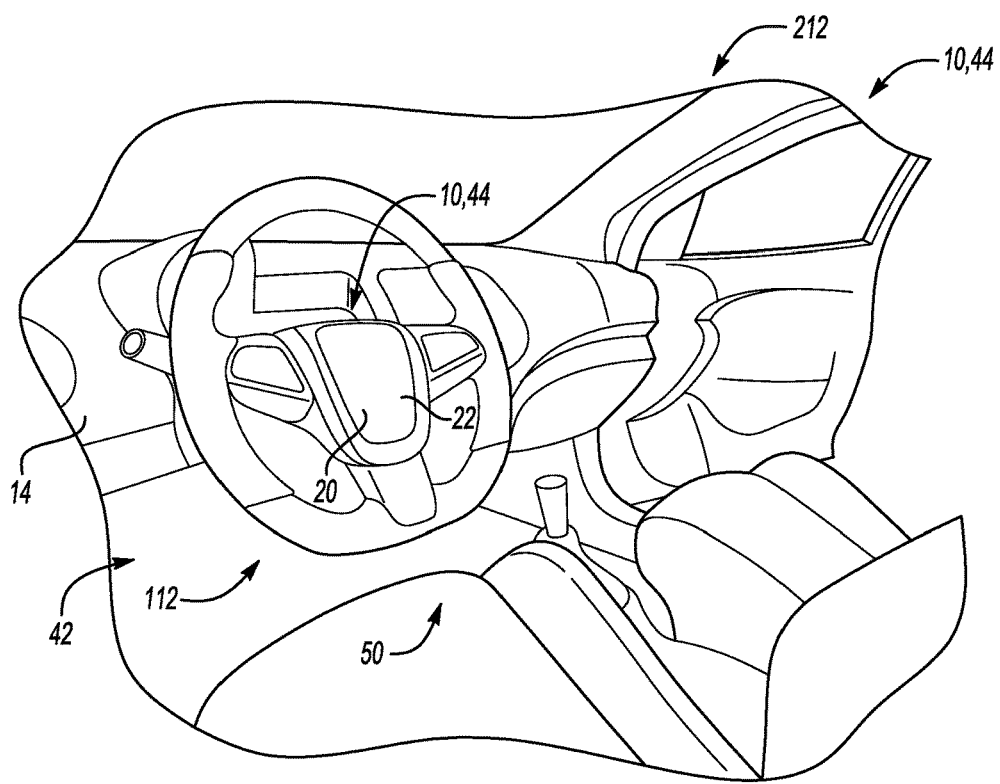
FIG. 4 is a schematic illustration of a perspective view of two examples of the substrate of FIG. 1.

Referring to the Figures, wherein like reference numerals refer to like elements, a display article 10 is shown generally in FIG. 1. The display article 10 may be useful for presenting information to a user for automotive applications requiring a tearable or severable substrate 12, such as, but not limited to, a steering wheel 112 (FIG. 4) or a support pillar 212 (FIG. 4) or an instrument panel (not shown) or a dashboard (not shown) or a seat cover (not shown) of a vehicle 14 (FIG. 4). However, the display article 10 may also be useful for non-automotive applications requiring a tearable substrate 12 that is capable of displaying information, such as, but not limited to, batteries, pressurized storage containers, and other components for residential, industrial, commercial, aviation, and rail applications.

Referring to FIGS. 1-3B, the display article 10 includes a film 16 formed from a stretchable plastic and including a first plurality of micro-light emitting diodes 18 and a second plurality of micro-light emitting diodes 118 disposed adjacent to the first plurality of micro-light emitting diodes 18. More specifically, the first plurality of micro-light emitting diodes 18 and the second plurality of micro-light emitting diodes 118 are embedded in the stretchable plastic.

As used herein, the terminology micro-light emitting diode 18, 118 (i.e., mLED or µLED or micro-LED) refers to microscopic light emitting diodes that are arranged to form individual pixel elements of the display article 10. That is, the micro-light emitting diodes 18, 118 emit light that may be arranged in patterns to display information to a user. Each of the first plurality and second plurality of micro-light emitting diodes 18, 118 may have a size that is, for example, approximately 15% of a size of an individual pixel of a 150 pixel-per-inch liquid crystal display (LCD). The first and second pluralities of micro-light emitting diodes 18, 118 may provide the display article 10 with excellent contrast, response times, and comparatively low energy consumption as compared to a standard liquid crystal display.

By way of general explanation, the first and second pluralities of micro-light emitting diodes 18, 118 may be produced by growing a plurality of thin-film stacks of workpieces (not shown) on a reusable wafer formed from gallium arsenide (GaAs). After growing, the workpieces may be debonded from the reusable wafer by etching the workpieces in hydrogen fluoride, and the workpieces may be subsequently stamp transferred onto a thin film transistor (TFT) backplane or stretchable plastic to produce the film 16. The film 16 may be characterized as ultrathin and may have a thickness of from about 0.1 mm to about 1 mm.

Figure 2:
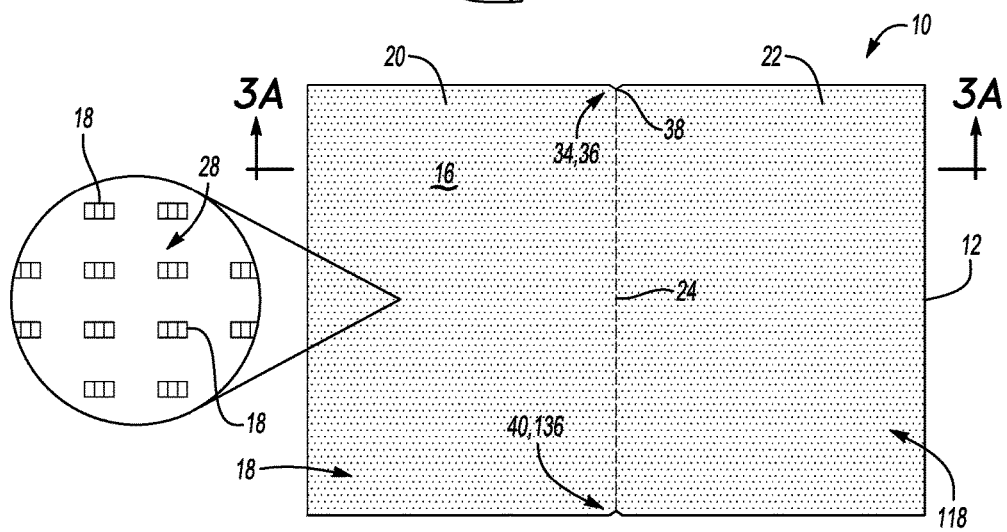
FIG. 2 is a schematic illustration of a top view of a portion of the display article of FIG. 1.

As best shown in FIG. 2, the first plurality of micro-light emitting diodes 18 and the second plurality of micro-light emitting diodes 118 are embedded in the stretchable plastic and may be arranged into arrays. Each of the first plurality and the second plurality of micro-light emitting diodes 18, 118 may be alternatingly or intermittently energized or lit according to a desired text, pattern, or image displayed to the user. For example, for a steering wheel 112 (FIG. 4) application, the first and second pluralities of micro-light emitting diodes 18, 118 may convey information such as temperature, travel directions, fuel range, and the like to the user during vehicle operation. Alternatively, for a support pillar 212 (FIG. 4) application, the first and second pluralities of micro-light emitting diodes 18, 118 may convey warning or status information to the user, i.e., whether a passenger restraint system is engaged, whether another vehicle (not shown) is present adjacent to the vehicle 14 during travel, and the like.

Since the film 16 and display article 10 may present information to an operator via the first and second plurality of micro-light emitting diodes 18, 118, the stretchable plastic may be transparent. In one non-limiting example, the stretchable plastic may be polydimethyl siloxane (PDMS) which may provide transparency, durability, formability, and tearability to the display article 10. Such PDMS stretchable plastic may replace other materials such as thermoplastic polyolefins which may suffer from a lack of transparency. As used herein, the terminology stretchable refers to a plastic that is non-rigid and pliable, i.e., capable of yielding to a stress or force and subsequently returning to an original shape.

Referring again to FIG. 2, the display article 10 also includes a substrate 12 having a first portion 20, a second portion 22 disposed adjacent the first portion 20, and a tear seam 24 disposed between the first portion 20 and the second portion 22. The tear seam 24 may be configured as a scored or perforated region such that the first portion 20 and the second portion 22 may separate from one another, as set forth in more detail below. That is, upon exposure to a force 26 (FIGS. 3A and 3B), the substrate 12 may tear or rip along the tear seam 24 to thereby separate the first portion 20 and the second portion 22 from one another.

Figure 3A:
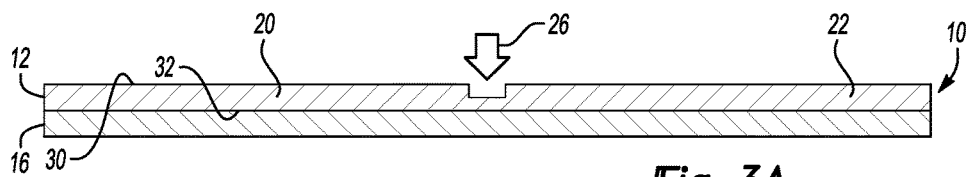
FIG. 3A is a schematic illustration of a cross-sectional view of one example of the display article of FIGS. 1 and 2 taken along section line 3A-3A.
Figure 3B:
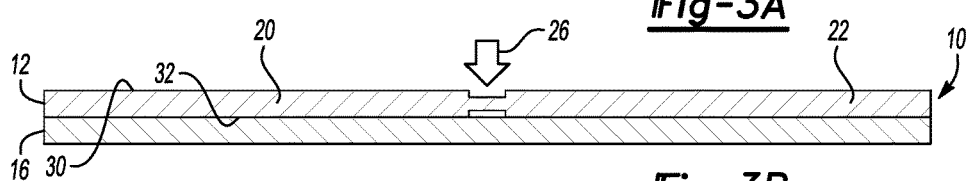
FIG. 3B is a schematic illustration of a side view of another example of the display article of FIG. 3A.

More specifically, as described with continued reference to FIGS. 2-3B, the film 16 is attached to the substrate 12 such that the tear seam 24 is located between the first plurality of micro-light emitting diodes 18 and the second plurality of micro-light emitting diodes 118. The film 16 may be disposed on and attached to the substrate 12 in any manner. For example, the film 16 may be adhered to the substrate 12 or may be otherwise bonded to the substrate 12. Alternatively, the film 16 may be conformably laminated to the substrate 12.

As such, the tear seam 24 may separate or demarcate two distinct regions or portions 20, 22 of the substrate 12. Referring again to the microscopic size of each of the first plurality and second pluralities of micro-light emitting diodes 18, 118, the tear seam 24 may be situated such that the tear seam 24 does not cross any individual one of the first and second plurality of micro-light emitting diodes 18, 118. Rather, the tear seam 24 may be arranged within a space 28 (FIG. 2) defined between adjacent ones of the first and second plurality of micro-light emitting diodes 18, 118. In one non-limiting embodiment, the display article 10 and substrate 12 may further include a plurality of tear seams 24, e.g., two or more tear seams 24 that may be arranged in any desired pattern.

As such, during operation of the display article 10, the film 16 and the substrate 12 may tear or rip at one or more predefined locations, i.e., at the one or more tear seams 24, upon application of the force 26 (FIGS. 3A and 3B) to the substrate 12. Therefore, the display article 10 is useful for applications requiring information transmittal via a tearable or separable substrate 12.

More specifically, as described with reference to FIG. 3A, the substrate 12 may have a first face 30 defining the tear seam 24 and a second face 32 spaced opposite the first face 30. That is, the tear seam 24 may be characterized as a groove or channel defined by the substrate 12. In another non-limiting example described with reference to FIG. 3B, the first face 30 and the second face 32 may define the tear seam 24 such that the tear seam 24 is visible from either face 30, 32 of the substrate 12. Therefore, the substrate 12 may be configured to tear along the tear seam 24 such that the first portion 20 separates from the second portion 22 when the force 26 is applied to the substrate 12 in a direction perpendicular to the first face 30.

Referring again to FIG. 2, in one embodiment, the tear seam 24 may have a first end 34 and the substrate 12 may define a first stress concentrator notch 36 at the first end 34. The first stress concentrator notch 36 may be V-shaped and may have a vertex 38, and the tear seam 24 may terminate at the vertex 38. In another embodiment, the tear seam 24 may have a second end 40 spaced apart from the first end 34, and the substrate 12 may define a second stress concentrator notch 136 at the second end 40. The first and second stress concentrator notches 36, 136 may each be configured to concentrate stress and initiate a tear along the tear seam 24 between the first portion 20 and the second portion 22 of the substrate 12.

The substrate 12 may be formed from a sturdy, durable material so as to support the film 16. For example, the substrate 12 may be formed from a plastic such as, but not limited to, polyethylene terephthalate. The plastic may be selected to provide excellent durability and tearability. Although not limited to automotive applications, in one example, the substrate 12 may be the steering wheel 112 (FIG. 4) of the vehicle 14. In yet another example, the substrate 12 may be the support pillar 212 (FIG. 4), e.g., an A-, B-, C-, or D-pillar 212, defining a passenger compartment 42 (FIG. 4) of the vehicle 14.

Referring again to FIG. 1, a component 44 includes the display article 10 and an airbag 46 disposed adjacent the substrate 12. That is, the airbag 46 may be disposed adjacent the substrate 12 such that the substrate 12 is disposed between the film 16 and the airbag 46. The airbag 46 may be a component of an airbag module 48 and may be designed to inflate rapidly and then quickly deflate upon application of the force 26 (FIGS. 3A and 3B) to the substrate 12, as set forth in more detail below. More specifically, the airbag 46 is configured for transitioning between a stowed position 50 (FIGS. 1 and 4) in which the airbag 46 does not extend through the substrate 12 and the film 16, and a deployed position 52 (FIG. 5) in which the airbag 46 extends through the substrate 12 and the film 16.

Figure 5:
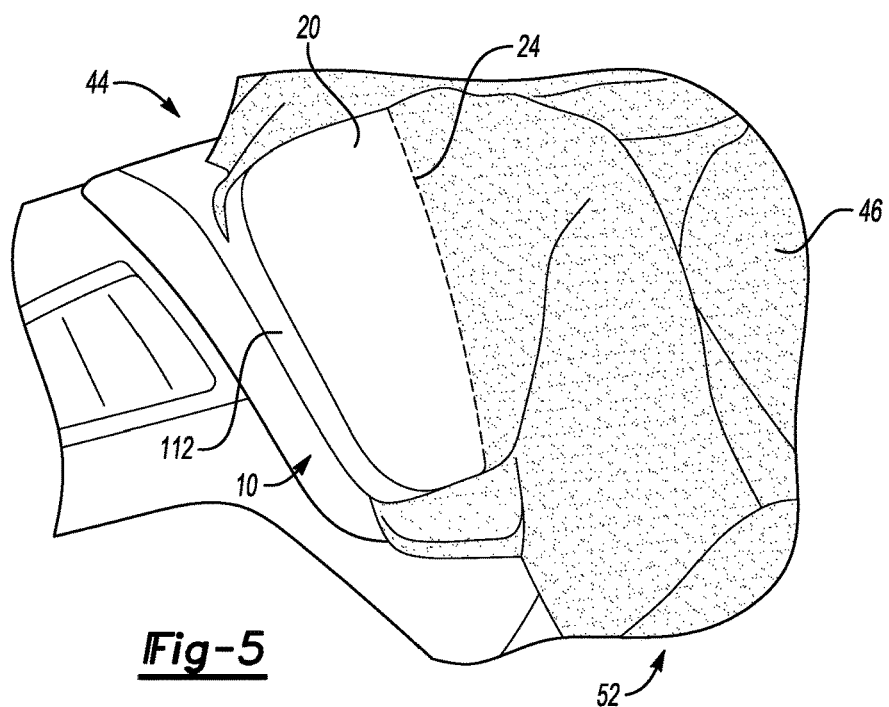
FIG. 5 is a schematic illustration of a perspective view of an airbag disposed in a deployed position and extending through the substrate and film of FIG. 1.

Referring now to FIG. 5, the first portion 20 and the second portion 22 are separated from one another at the tear seam 24 when the airbag 46 is disposed in the deployed position 52. Conversely, as shown in FIG. 4, the first portion 20 and the second portion 22 may be joined at the tear seam 24 when the airbag 46 is disposed in the stowed position 50. That is, the airbag 46 may transition from the stowed position 50 to the deployed position 52 in response to the force 26 (FIGS. 3A and 3B) applied to the substrate 12 in the direction perpendicular to the tear seam 24, and the film 16 may be separatable into at least two segments or portions 20, 22 as the airbag 46 transitions from the stowed position 50 to the deployed position 52 along the tear seam 24. Yet, the film 16 also allows information to be displayed to the user when the airbag 46 is disposed in the stowed position 50.

In yet another embodiment, although not shown, the display article 10 may include a plastic encapsulated liquid crystal display and a light emitting diode matrix backlight. For this embodiment, both the plastic encapsulated liquid crystal display and the light emitting diode backlight may each include the tear seam 24 such that the display article 10 may separate into at least two portions 20, 22 upon application of the force 26 to the display article 10.

In a further embodiment, although not shown, the film 16 may include an organic light emitting diode plastic film that is laminated or otherwise attached to the substrate 12. The organic light emitting diode plastic film may include a plurality of organic thin films disposed between two conductors. In this embodiment, the display article 10 may not include a backlight and the film 16 and substrate 12 may include the tear seam 24. As such, the film 16 and the substrate 12 may tear along the tear seam 24 when the force 26 is applied to the display article 10.

In an additional embodiment, although not shown, the display article 10 may include a pico projector configured for emitting an image, and a plastic projection screen configured for receiving the image thereon. For this embodiment, the plastic projection screen may include the tear seam 24 and may separate into two portions 20, 22 upon application of the force 26 in the direction perpendicular to the tear seam 24.

As such, the display article 10 and component 44 described above provide a tearable display surface for applications requiring both information presentation and separability under certain conditions, i.e., the application of the force 26. That is, the display article 10 and component 44 allow for a controlled tear or separation of the substrate 12 and the film 16, i.e., in a predictable and selected location on the substrate 12 and film 16, such that the display article 10 may separate into two distinct portions 20, 22 upon application of the force 26. As such, the display article 10 and component 44 enable displays that dismantle in a controlled manner along the tear seam 24 when desired. Therefore, the display articles 10 are suitable for applications requiring both presentation of data to a user and pressurized deployment of an airbag 46 or other internal contents.

While the best modes for carrying out the disclosure have been described in detail, those familiar with the art to which this disclosure relates will recognize various alternative designs and embodiments for practicing the disclosure within the scope of the appended claims.

What is claimed is:

1. A display article comprising:
a film formed from a stretchable plastic and including a first plurality of micro-light emitting diodes and a second plurality of micro-light emitting diodes disposed adjacent to the first plurality of micro-light emitting diodes;
wherein the stretchable plastic is transparent;
wherein the stretchable plastic is formed from polydimethyl siloxane;
wherein the first plurality of micro-light emitting diodes and the second plurality of micro-light emitting diodes are embedded in the stretchable plastic; and
a substrate having a first portion, a second portion disposed adjacent the first portion, and a tear seam disposed between the first portion and the second portion;
wherein the substrate is formed from polyethylene terephthalate;
wherein the film is adhered to the substrate such that the tear seam is located between the first plurality of micro-light emitting diodes and the second plurality of micro-light emitting diodes;
wherein the substrate has a first face and a second face spaced opposite the first face, wherein at least one of the first face and the second face define the tear seam; and further wherein the substrate is configured to tear along the tear seam such that the first portion separates from the second portion when a force is applied to the substrate in a direction perpendicular to the first face;
wherein the substrate is at least one of a steering wheel of a vehicle and a support pillar defining a passenger compartment of the vehicle.

2. A display article comprising:
a film formed from a stretchable plastic and including a first plurality of micro-light emitting diodes and a second plurality of micro-light emitting diodes disposed adjacent to the first plurality of micro-light emitting diodes;
wherein the first plurality of micro-light emitting diodes and the second plurality of micro-light emitting diodes are embedded in the stretchable plastic; and
a substrate having a first portion, a second portion disposed adjacent the first portion, and a tear seam having a first end and disposed between the first portion and the second portion;
wherein the substrate defines a first stress concentrator notch at the first end;
wherein the film is attached to the substrate such that the tear seam is located between the first plurality of micro-light emitting diodes and the second plurality of micro-light emitting diodes.

3. The display article of claim 2, wherein the first stress concentrator notch is V-shaped and has a vertex, and further wherein the tear seam terminates at the vertex.

4. The display article of claim 2, wherein the tear seam has a second end spaced apart from the first end, and further wherein the substrate defines a second stress concentrator notch at the second end.

5. A component comprising:
a display article including:
a film formed from a stretchable plastic and including a first plurality of micro-light emitting diodes and a second plurality of micro-light emitting diodes disposed adjacent to the first plurality of micro-light emitting diodes;

wherein the first plurality of micro-light emitting diodes and the second plurality of micro-light emitting diodes are embedded in the stretchable plastic;

a substrate having a first portion, a second portion disposed adjacent the first portion, and a tear seam disposed between the first portion and the second portion;

wherein the film is attached to the substrate such that the tear seam is located between the first plurality of micro-light emitting diodes and the second plurality of micro-light emitting diodes; and an airbag disposed adjacent the substrate and configured for transitioning between:

a stowed position in which the airbag does not extend through the substrate and the film; and a deployed position in which the airbag extends through the substrate and the film;

wherein the first portion and the second portion are separated from one another at the tear seam when the airbag is disposed in the deployed position.

6. The component of claim 5, wherein the first portion and the second portion are joined at the tear seam when the airbag is disposed in the stowed position.

7. The component of claim 5, wherein the airbag transitions from the stowed position to the deployed position in response to a force applied to the substrate in a direction perpendicular to the tear seam.

8. The component of claim 5, wherein the film is separatable into at least two segments as the airbag transitions from the stowed position to the deployed position.

9. The component of claim 5, wherein the airbag is disposed adjacent the substrate such that the substrate is disposed between the film and the airbag.

10. The component of claim 5, wherein the stretchable plastic is transparent.

11. The component of claim 5, wherein the substrate is a steering wheel.

12. The component of claim 5, wherein the substrate is a support pillar defining a passenger compartment of a vehicle.

* * * * *